(12) United States Patent
Kato

(10) Patent No.: US 7,227,264 B2
(45) Date of Patent: Jun. 5, 2007

(54) SEMICONDUCTOR DEVICE AND METHOD FOR MANUFACTURING SEMICONDUCTOR DEVICE

(75) Inventor: Juri Kato, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/957,164

(22) Filed: Sep. 30, 2004

(65) Prior Publication Data
US 2005/0104134 A1    May 19, 2005

(30) Foreign Application Priority Data
Oct. 1, 2003   (JP)   ............... 2003-343517

(51) Int. Cl.
*H01L 23/48*   (2006.01)
*H01L 21/4763*   (2006.01)

(52) U.S. Cl. ............ 257/750; 257/751; 257/774; 438/637; 438/643

(58) Field of Classification Search ............ 257/750, 257/751, 774, 744; 438/629, 637, 643, 93
See application file for complete search history.

(56) References Cited

U.S. PATENT DOCUMENTS 5,886,385 A * 3/1999 Arisumi et al. ............ 257/347
6,096,590 A 8/2000 Chan et al.
6,548,838 B1 * 4/2003 Anda et al. ............ 257/192
2002/0117665 A1 * 8/2002 Yaegassi et al. ............ 257/47

FOREIGN PATENT DOCUMENTS

| JP | 63-147318 | 6/1988 |
| JP | 63-169755 | 7/1988 |
| JP | 10-70274 | 3/1998 |
| JP | 2002-009015 | 1/2002 |
| WO | WO-02/33746 | 4/2002 |

OTHER PUBLICATIONS

Examination Result dated Dec. 11, 2005 in Japanese.

* cited by examiner

*Primary Examiner*—Hsien-Ming Lee
(74) *Attorney, Agent, or Firm*—John J. Penny, Jr.; George N. Chaclas; Edwards Angell Palmer & Dodge, LLP

(57) ABSTRACT

Single-crystalline silicon layers 7a and 7b are selectively formed on LDD layers 5a and 5b by an epitaxial growth method. Opening sections 10a and 10b are formed, which expose a source layer 8 and a drain layer 8b, respectively, through an interlayer dielectric film 9 and the single-crystalline silicon layers 7a and 7b, respectively, and then, plugs 12a and 12b are formed in the opening sections 10a and 10b embedded through barrier metal films 11a and 11b, respectively.

7 Claims, 4 Drawing Sheets

SEMICONDUCTOR DEVICE AND METHOD FOR MANUFACTURING SEMICONDUCTOR DEVICE

Japanese Patent Application No 2003-343517, from which priority is claimed, is hereby incorporated by reference.

BACKGROUND OF THE INVENTION

Technical Field

The present invention relates to semiconductor devices and methods for manufacturing semiconductor devices, and in particularly relates to the contact structure of semiconductor layers.

In recent years, the size of devices such as transistors has been reduced along with higher integration of semiconductor devices, and their contact areas to make contacts with semiconductor layers has also been reduced.

Moreover, the recent trend to manufacture wearable electronic apparatuses has accelerated the demand for increased energy efficiency of devices. In this trend, CMOS circuits each combining a P-type transistor and an N-type transistor are effective in lowering the power consumption of devices, and therefore are mounted on various electronic apparatuses.

Japanese Laid-open Patent Application 2002-9015 describes a method for forming lead-out electrode layers having a small resistance to both an N type semiconductor region and a P type semiconductor region, wherein polycrystalline silicon, which is doped with an impurity at a high concentration at the time of deposition, is used in the N type semiconductor region that uses a smaller amount of metallic material that can form an ohmic contact, and metallic material that can form an ohmic contact is used in the P type semiconductor region.

Also, field effect transistors are formed on a SOI substrate, because of its ability for element isolation, latch-up-free characteristic, and small source/drain junction capacitance. In particular, since completely depleted SOI transistors can achieve low power consumption and high-speed operation, and their low voltage driving is easy, research into operation of SOI transistors in a completely depleted mode is actively conducted.

However, when a contact area for forming a contact with a semiconductor layer is reduced, the contact resistance increases. This causes a problem in that higher speed and lower power consumption of devices are prevented. In particular, in a CMOS structure, since it is difficult to obtain metallic material having a small resistance to both an N type semiconductor region and a P type semiconductor region, it is difficult to obtain good contact characteristics.

Also, according to Japanese Laid-open Patent Application 2002-9015, in order to form lead-out electrode layers having a small resistance to an N type semiconductor region and a P type semiconductor region, different electrode structures are used for the N type semiconductor region and the P type semiconductor region, respectively. This causes a problem in that its contact structure becomes complex.

Also, in order to operate a SOI transistor in a completely depleted mode, a single-crystalline silicon layer of a SOI substrate needs to be made into a thin film. For this reason, the control of the contact resistance between wirings and the single-crystalline silicon layer becomes difficult, which causes a problem in that driving at a low voltage is prevented.

SUMMARY OF THE INVENTION

Therefore, it is an object of one embodiment of the present invention to provide semiconductor devices and methods for manufacturing semiconductor devices, which can prevent the contact structure from becoming complex, and can reduce the contact resistance.

To solve the problems described above, a semiconductor device in accordance with an embodiment of the present invention comprises: a plurality of semiconductor layers disposed in a contact region, and having mutually different band gaps or electron affinities; and a metal wiring layer that contacts the plurality of semiconductor layers in the contact region.

As a result, in the contact area, a plurality of energy barriers can be provided with respect to the work function of the metal wiring layer, such that a contact resistance can be chosen so as to correspond to a lower one of the energy barriers. For this reason, the contact resistance can be reduced without changing the composition of the metal wiring layer, and the device with a higher speed and lower power consumption can be attained while further miniaturizing the device.

A semiconductor device in accordance with an embodiment of the present invention comprises: a first semiconductor layer; a second semiconductor layer stacked on the first semiconductor layer and having a band gap or an electron affinity different from that of the first semiconductor layer; an opening section that penetrates the second semiconductor layer and exposes the first semiconductor layer; and a metal wiring layer that is embedded in the opening section, contacts the first semiconductor layer at a bottom of the opening section, and contacts the second semiconductor layer at a side surface of the opening section.

As a result, the metal wiring layer can be brought in contact with a plurality of semiconductor layers without changing the contact size, the device can be miniaturized, and the contact resistance can be reduced, such that the device with a higher speed and lower power consumption can be attained.

Also, a semiconductor device in accordance with an embodiment of the present invention comprises: a semiconductor substrate; a gate electrode formed on the semiconductor substrate; source/drain layers disposed on both sides of the gate electrode, and formed in the semiconductor substrate; a semiconductor layer stacked on the source/drain layers and having a band gap or an electron affinity different from that of the semiconductor substrate; an opening section that penetrates the semiconductor layer and exposes the source layer or the drain layer; and a metal wiring layer that is embedded in the opening section, contacts the source layer or the drain layer at a bottom of the opening section, and contacts the semiconductor layer at a side surface of the opening section.

As a result, even when an N type semiconductor and a P type semiconductor have different energy barriers to a metal material, the energy barriers in an N type semiconductor region and a P type semiconductor region can be lowered without changing the composition of the metal wiring layer in the N type semiconductor region and the P type semiconductor region. For this reason, the contact structure can be controlled so as not to become complex, and good contact characteristics can be obtained for both of the N type semiconductor region and the P type semiconductor region, CMOS circuits can be effectively manufactured, and the device with a lower power consumption can be attained.

Also, a semiconductor device in accordance with an embodiment of the present invention comprises: a first semiconductor layer formed on a dielectric layer; a second semiconductor layer stacked on the first semiconductor layer and having a band gap or an electron affinity different from that of the first semiconductor layer; an opening section that penetrates the first semiconductor layer and the second semiconductor layer and reaches the dielectric layer; and a metal wiring layer that is embedded in the opening section, and contacts the first semiconductor layer and the second semiconductor layer at a side surface of the opening section.

As a result, even when the first semiconductor layer is penetrated, the metal wiring layer can be prevented from becoming short-circuited at the bottom side of the first semiconductor layer, and the metal wiring layer can be brought in contact with a plurality of semiconductor layers without changing the size of the contact. Accordingly, even when the first semiconductor layer is thinned down into a thin film, the contact resistance can be reduced while miniaturizing the device, and the field effect transistor can be operated in a completely depleted mode, such that operations of the field effect transistor at a higher speed with a lower voltage can be attained.

Also, a semiconductor device in accordance with an embodiment of the present invention comprises: a first semiconductor layer formed on a dielectric layer; a gate electrode formed on the first semiconductor layer; source/drain layers disposed on both sides of the gate electrode, and formed in the first semiconductor layer with bottom sections thereof reaching the dielectric layer; a second semiconductor layer stacked on the source/drain layers and having a band gap or an electron affinity different from that of the first semiconductor layer; an opening section that penetrates the source layer or the drain layer and the second semiconductor layer and reaches the dielectric layer; and a metal wiring layer that is embedded in the opening section, and contacts the source layer or the drain layer and the second semiconductor layer at a side surface of the opening section.

As a result, even when the source or drain layer is penetrated, the source or drain layer can be prevented from becoming short-circuited through the metal wiring layer embedded in the opening section. Also, the energy barriers in an N type semiconductor region and a P type semiconductor region can be lowered without changing the composition of the metal wiring layer in the N type semiconductor region and the P type semiconductor region.

For this reason, even when the first semiconductor layer is thinned down into a thin film, the contact structure can be controlled so as not to become complex, and good contact characteristics can be obtained for both of the N type semiconductor region and the P type semiconductor region. Therefore, CMOS circuits can be effectively manufactured, and the device with a lower power consumption can be attained. Also, the field effect transistor can be operated in a completely depleted mode, such that operations of the field effect transistor at a higher speed with a lower voltage can be attained.

Also, a semiconductor device in accordance with an embodiment of the present invention is characterized in that the semiconductor substrate or the semiconductor layer is Si, Ge, SiGe, SiC, SiSn, PbS, GaAs, InP, GaP, GaN or ZnSe.

As a result, various semiconductor layers can be combined, to thereby lower the energy barrier with the metal wiring layer, and the contact resistance can be effectively reduced.

Furthermore, a method for manufacturing a semiconductor device in accordance with an embodiment of the present invention comprises the steps of: forming semiconductor layers having mutually different band gaps or electron affinities on a semiconductor substrate; forming an interlayer dielectric film on the semiconductor layers; forming an opening section that penetrates the interlayer dielectric film and the semiconductor layers and exposes the semiconductor substrate; and forming a metal wiring layer that is embedded in the opening section, contacts the semiconductor substrate at a bottom of the opening section, and contacts the semiconductor layer at a side surface of the opening section, on the interlayer dielectric film.

As a result, through adjusting the depth of the opening section, the metal wiring layer can be brought in contact with a plurality of semiconductor layers, and the contact resistance can be lowered without changing the size of the contact area.

Moreover, a method for manufacturing a semiconductor device in accordance with an embodiment of the present invention comprises the steps of: forming a second semiconductor layer on a first semiconductor layer provided on a dielectric layer, which have mutually different band gaps or electron affinities; forming an interlayer dielectric film on the second semiconductor layer; forming an opening section that penetrates the interlayer dielectric film, the first semiconductor layer and the second semiconductor layer, and reaches the dielectric layer; and forming a metal wiring layer that is embedded in the opening section, and contacts the first semiconductor layer and the second semiconductor layer at a side surface of the opening section on the interlayer dielectric film.

As a result, without setting a restriction on the amount of over etching of the first semiconductor layer, the metal wiring layer can be brought in contact with a plurality of semiconductor layers, thinning of the first semiconductor layer can be accommodated, and the contact resistance can be reduced.

DESCRIPTION OF THE EMBODIMENTS OF THE INVENTION

Semiconductor devices and methods for manufacturing the same in accordance with embodiments of the present invention are described below with reference to the accompanying drawings.

FIGS. 1(a)–1(c) and FIGS. 2(a)–2(c) are cross-sectional views showing a method for manufacturing a semiconductor device in accordance with a first embodiment of the present invention.

Figure 1:
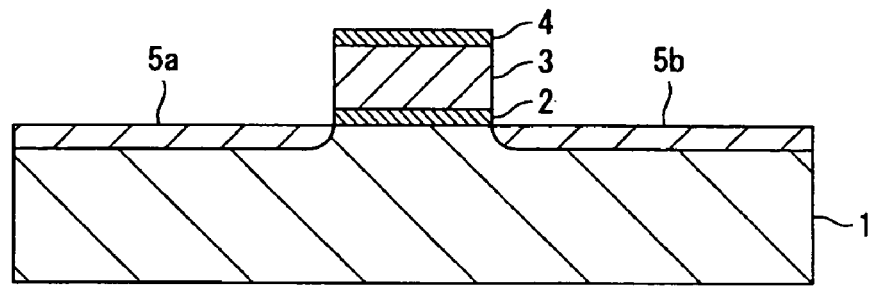
FIGS. 1(a)–1(c) are cross-sectional views showing a method for manufacturing a semiconductor device in accordance with a first embodiment of the present invention.
Figure 1:
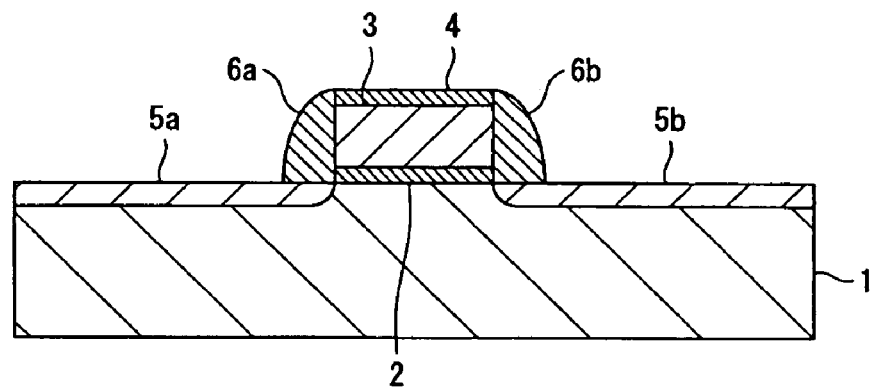
Figure 1:
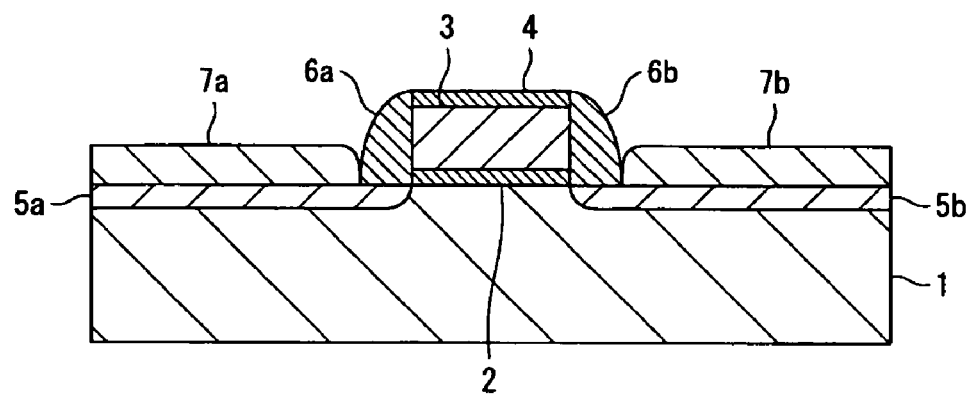

Referring to FIG. 1(a), a semiconductor substrate 1 is thermally oxidized to form a gate dielectric film 2 on the semiconductor substrate 1. Then, by a CVD method or the like, a polycrystalline silicon layer and a dielectric layer are successively stacked in layers on the semiconductor substrate 1 where the gate dielectric film 2 is formed. The polycrystalline silicon layer and the dielectric layer are patterned by using a photolithography technique and a dry etching technique, thereby forming a gate electrode 3 and a cap layer 4 on the gate dielectric layer 2. Then, by using the gate electrode 3 as a mask, impurities, such as, As, P, B, or the like, are ion-injected in the semiconductor substrate 1, to thereby form LDD (lightly Doped Drain) layers 5a and 5b composed of low concentration impurity doped layers disposed on both sides of the gate electrode 3 in the semiconductor substrate 1.

Then, as shown in FIG. 1(b), a dielectric layer is formed by a CVD method or the like on the semiconductor substrate 1 where the LDD layers 5a and 5b are formed, and the dielectric layer is etched back by anisotropic etching such as RIE, thereby forming side walls 6a and 6b on side walls of the gate electrode 3, respectively.

Next, as shown in FIG. 1(c), single-crystalline semiconductor layers 7a and 7b are selectively formed by epitaxial growth on the LD D layers 5a and 5b. It is noted that the single-crystalline semiconductor layers 7a and 7b can be composed to have a band gap or an electron affinity that is different from that of the semiconductor substrate 1. The materials of the semiconductor substrate 1 and the single-crystalline semiconductor layers 7a and 7b can be selected from, for example, Group IV elements such as Si, Ge, SiGe, SiC, SiSn and PbS, Group III–V elements such as GaAs, GaN, InP and GaP, Group II–VI elements such as ZnSe, or Group IV–VI elements. In particular, a combination of Si as the semiconductor substrate 1 and SiGe as the single-crystalline semiconductor layers 7a and 7b can readily make a lattice match, and therefore the single-crystalline semiconductor layers 7a and 7b can be stably formed on the semiconductor substrate 1.

Here, by forming the single-crystalline semiconductor layers 7a and 7b by using an epitaxial growth method, the single-crystalline semiconductor layers 7a and 7b can be prevented from growing on the dielectric layer. For this reason, the single-crystalline semiconductor layers 7a and 7b can be selectively grown on the LDD layers 5a and 5b, while preventing the single-crystalline semiconductor layers 7a and 7b from growing on the cap layer 4 and the side walls 6a and 6b.

Also, by forming the single-crystalline semiconductor layers 7a and 7b after forming the LDD layers 5a and 5b and before forming a source layer 8a and a drain layer 8b, the influence of impurity concentration can be suppressed when the single-crystalline semiconductor layer 7a and 7b are grown, such that the single-crystalline semiconductor layers 7a and 7b can be stably formed, and the single-crystalline semiconductor layers 7a and 7b can be prevented from coming in contact with the gate electrode 3.

Figure 2:
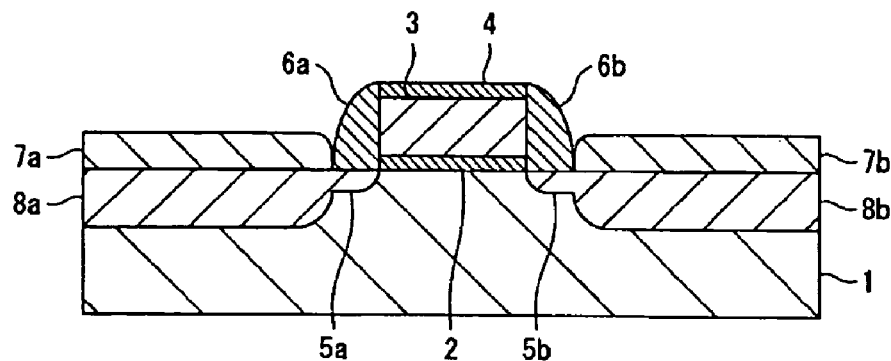
FIGS. 2(a)–2(c) are cross-sectional views showing the method for manufacturing a semiconductor device in accordance with the first embodiment of the present invention.
Figure 2:
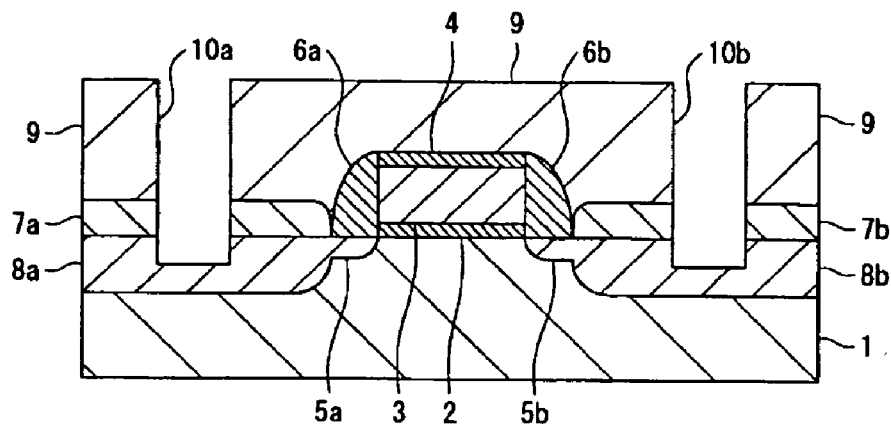
Figure 2:
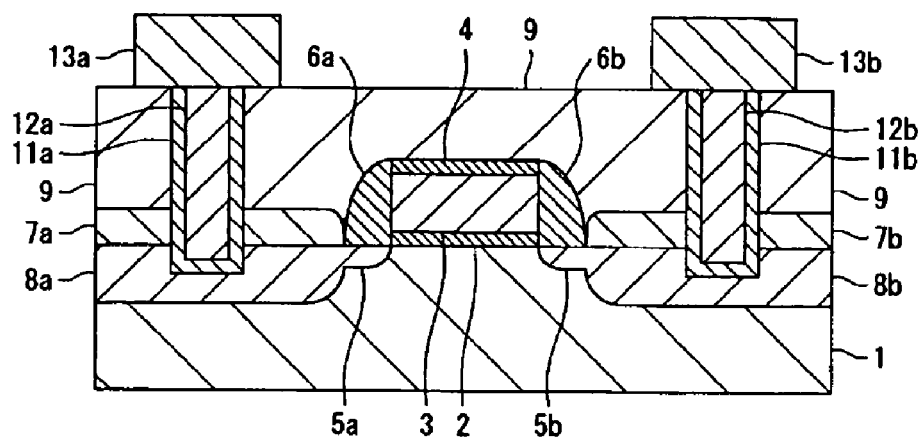

Next, as shown in FIG. 2(a), by using the gate electrode 3 and the side walls 6a and 6b, impurities such as As, P, B or the like are ion-injected in the semiconductor substrate 1 where the single-crystalline semiconductor layers 7a and 7b are formed, thereby forming a source layer 8a and a drain layer 8b composed of high concentration impurity doped layers disposed on the sides of the side walls 6a and 6b in the semiconductor substrate 1.

Next, as shown in FIG. 2(b), an interlayer dielectric film 9 is formed over the gate electrode 6 by, for example, a plasma CVD method. Then, by using a photolithography technique and an etching technique, opening sections 10a and 10b, that expose the source layer 8a and the drain layer 8b, respectively, through the interlayer dielectric film 9 and the single-crystalline semiconductor layers 7a and 7b, are formed. When the source layer 8a and the drain layer 8b are exposed, the source layer 8a and the drain layer 8b can be over etched, such that concave sections may be formed in the source layer 8a and the drain layer 8b. However, when the source layer 8a and the drain layer 8b can be over etched, it is necessary that the source layer 8a and the drain layer 8b should not be penetrated.

Next, as shown in FIG. 2(c), plugs 12a and 12b are formed in the opening sections 10a and 10b, respectively, embedded through barrier metal films 11a and 11b, respectively. For example, stacked layered films composed of Ti/TiN may be used as the barrier metal films 11a and 11b, and for example, W, Al, Cu or polycrystalline silicon can be used as the material of the plugs 12a and 12b.

Then, a metal film is sputtered on the interlayer dielectric film 9 where the plug 12a and 12b are formed. The metal film is patterned by using a photolithography technique and an etching technique, thereby forming metal wiring layers 13a and 13b that are connected to the plugs 12a and 12b, respectively, on the dielectric layer 9. It is noted here that the ohmic property of the contact resistance can be decided by the Schottky barrier Ψsbh between metal and semiconductor. Also, the Schottky barrier Ψsbh can be decided by the difference between the work function ψm of the metal and the electron affinity Xs of the semiconductor, as follows:

$$\Psi sbh(e) = \psi m - Xs$$

$$\Psi sbh(h) = Eg/q - (\psi m - Xs)$$

$$Eg/q = \Psi sbh(e) + \Psi sbh(h)$$

where, Ψsbh (e) is the Schottky barrier to free electrons from the metal to the semiconductor, and Ψsbh (h) is the Schottky barrier to holes from the metal to the semiconductor.

It is noted that the migration of free electrons from the semiconductor to the metal can be decided by ψm–ψs, where ψs is the work function of the semiconductor, and the work function of the semiconductor ψs changes with the doping amount of impurities.

When the barrier metal films 11a and 11b are brought in contact with both of the semiconductor substrate 1 and the single-crystalline semiconductor layers 7a and 7b, which have mutually different band gaps or electron affinities, respectively, a plurality of energy barriers can be created with respect to the work function of the metal material, and the contact resistance can be decided so as to correspond to the lower one of the energy barriers.

Therefore, the contact resistance can be lowered without changing the composition of the metal wiring layers 13a and 13b, and the device can attain a higher speed and lower power consumption while the device can be miniaturized.

Also, by bringing the metal material in contact with a plurality of semiconductor layers having mutually different band gaps or electron affinities, the energy barriers in an N type semiconductor region and a P type semiconductor region can be lowered without changing the composition of the metal wiring layers 13a and 13b in the N type semiconductor region and the P type semiconductor region, respectively. For this reason, the contact structure can be controlled so as not to become complex, and good contact characteristics can be obtained for both of the N type semiconductor region and the P type semiconductor region, the CMOS circuit can be effectively manufactured, and the device with a lower power consumption can be attained.

In addition, even when the contact resistance is decided depending on the tunnel effect, the width of the depletion layer shortens in the same dopant concentration if the barrier is low, and therefore the contact resistance can be stably lowered even when variations occur in the dopant concentration in the semiconductor.

FIGS. 3(a)–3(c) and FIGS. 4(a)–4(c) are cross-sectional views showing a method for manufacturing a semiconductor device in accordance with a second embodiment of the present invention.

Figure 3:
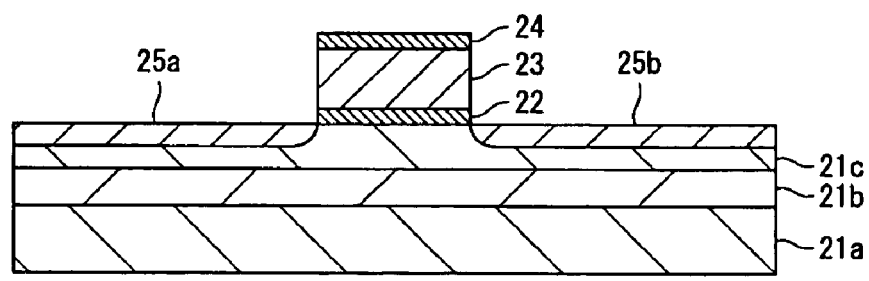
FIGS. 3(a)–3(c) are cross-sectional views showing a method for manufacturing a semiconductor device in accordance with a second embodiment of the present invention.
Figure 3:
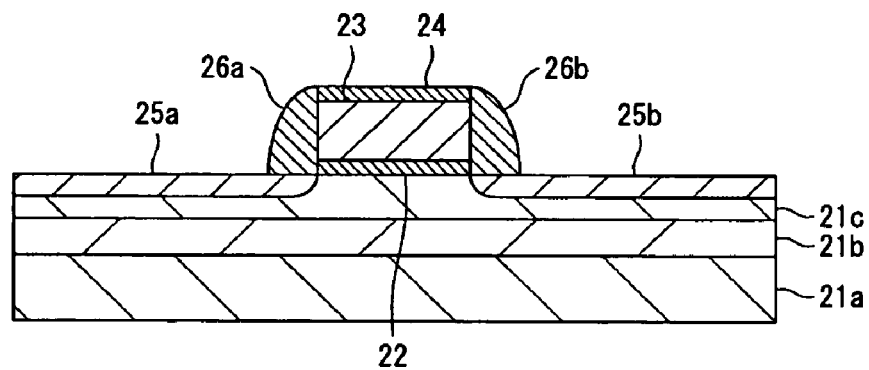
Figure 3:
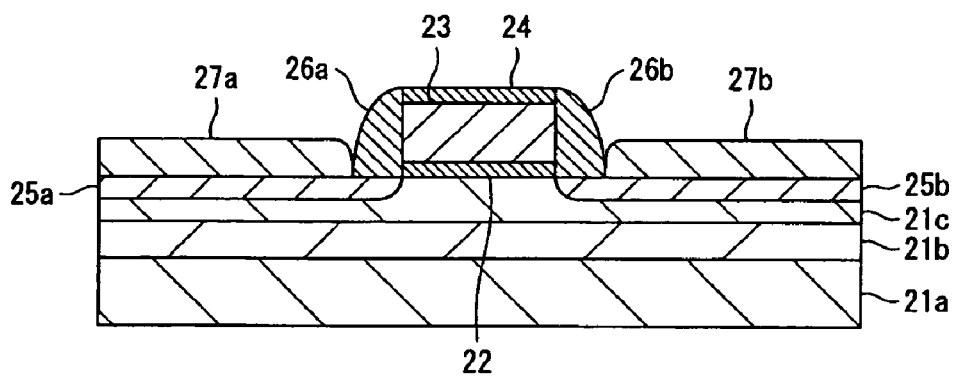

Referring to FIG. 3(a), a dielectric layer 21b is formed on a semiconductor substrate 21a, and a single-crystalline semiconductor layer 21c is formed on the dielectric layer 21b. As the materials of the semiconductor substrate 21a and the single-crystalline semiconductor layer 21c, for example, Si, Ge, SiGe, SiC, SiSn, PbS, GaAs, InP, GaP, GaN or ZnSe can be used, and as the dielectric layer 21b, for example, SiO2, SiON or Si$_3$N$_4$ can be used. Furthermore, as the semiconductor substrate 21 in which the single-crystalline semiconductor layer 21c is formed on the dielectric layer 21b, for example, a SOI substrate can be used. As the SOI substrate, for example, a SIMOX (Separation by Implanted Oxygen) substrate, a laminated substrate, or a laser-annealed substrate can be used. Also, besides the semiconductor substrate 21a, a dielectric substrate, such as, a sapphire substrate, a glass substrate, a ceramics substrate, or the like may be used.

Then, the single-crystalline semiconductor layer 21c is thermally oxidized to form a gate dielectric film 22 on the single-crystalline semiconductor layer 21c. Then, by a CVD method or the like, a polycrystalline silicon layer and a dielectric layer are successively stacked in layers on the single-crystalline semiconductor layer 21c where the gate dielectric film 22 is formed. The polycrystalline silicon layer and the dielectric layer are patterned by using a photolithography technique and a dry etching technique, thereby forming a gate electrode 23 and a cap layer 24 on the gate dielectric layer 22. Then, by using the gate electrode 23 as a mask, impurities, such as, As, P, B or the like are ion-injected in the single-crystalline semiconductor layer 21c, to thereby form LDD (lightly Doped Drain) layers 25a and 25b composed of low concentration impurity doped layers disposed on both sides of the gate electrode 23 in the single-crystalline semiconductor layer 21c.

Then, as shown in FIG. 3(b), a dielectric layer is formed by a CVD method or the like on the single-crystalline semiconductor layer 21c where the LDD layers 25a and 25b are formed, and the dielectric layer is etched back by anisotropic etching such as RIE, thereby forming side walls 26a and 26b on side walls of the gate electrode 23, respectively.

Next, as shown in FIG. 3(c), single-crystalline semiconductor layers 27a and 27b are selectively formed by epitaxial growth on the LDD layers 25a and 25b. It is noted that the single-crystalline semiconductor layers 27a and 27b can be composed to have a band gap or an electron affinity that is different from that of the single-crystalline semiconductor layer 21c. The materials of the single-crystalline semiconductor layers 27a and 27b can be selected from, for example, Group IV elements such as Si, Ge, SiGe, SiC, SiSn and PbS, Group III–V elements such as GaAs, GaN, InP and GaP, Group II–VI elements such as ZnSe, or Group IV–VI elements. In particular, a combination of Si as the single-crystalline semiconductor layer 21c and SiGe as the single-crystalline semiconductor layers 27a and 27b can readily make a lattice match, and therefore the single-crystalline semiconductor layers 27a and 27b can be stably formed on the single-crystalline semiconductor layer 21c.

Figure 4:
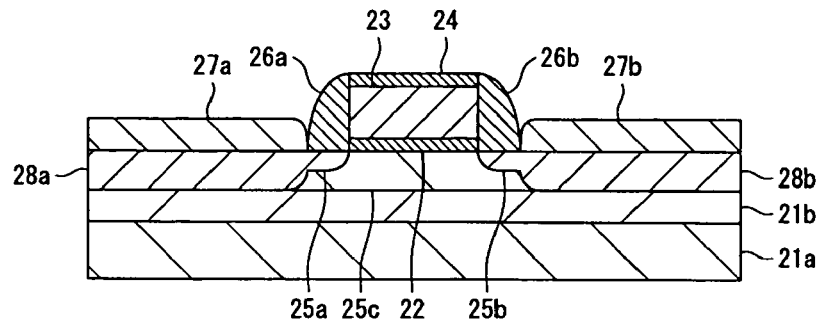
FIGS. 4(a)–4(c) are cross-sectional views showing the method for manufacturing a semiconductor device in accordance with the second embodiment of the present invention.
Figure 4:
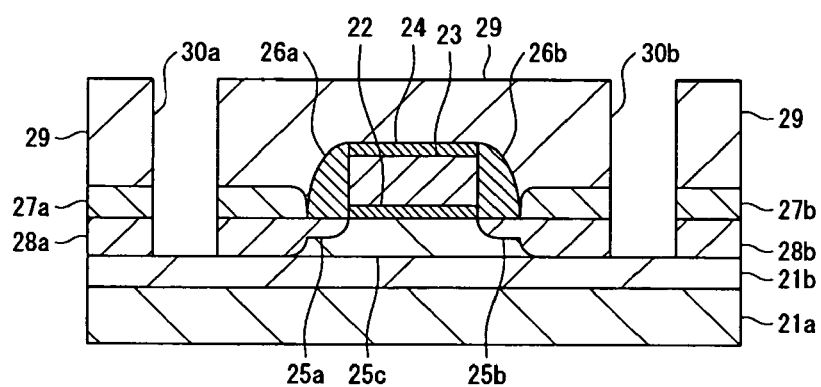
Figure 4:
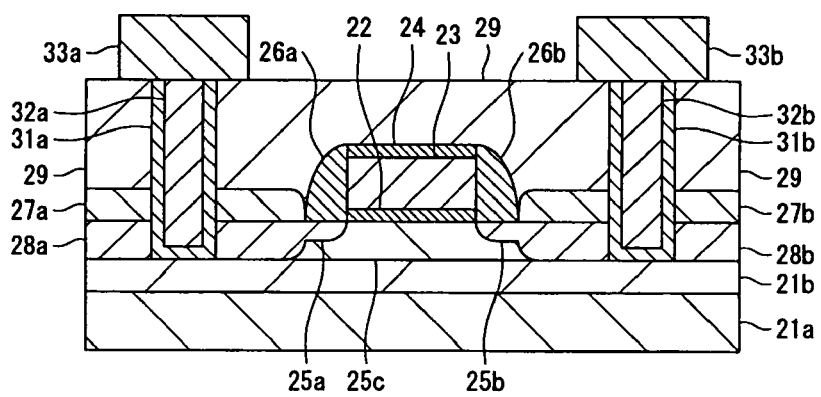

Next, as shown in FIG. 4(a), by using the gate electrode 23 and the side walls 26a and 26b, impurities such as As, P, B or the like are ion-injected in the single-crystalline semiconductor layer 21c where the single-crystalline semiconductor layers 27a and 27b are formed, thereby forming a source layer 28a and a drain layer 28b composed of high concentration impurity doped layers with their bottom surfaces contacting the dielectric layer 21b, disposed on the sides of the side walls 26a and 26b in the single-crystalline semiconductor layer 21c.

Next, as shown in FIG. 4(b), an interlayer dielectric film 29 is formed over the gate electrode 26 by, for example, a plasma CVD method. Then, by using a photolithography technique and an etching technique, opening sections 30a and 30b, that expose the source layer 28a and the drain layer 28b, respectively, through the interlayer dielectric film 29 and the single-crystalline semiconductor layers 27a and 27b, are formed.

When the source layer 28a and the drain layer 28b are exposed, the source layer 28a and the drain layer 28b can be over etched, such that concave sections may be formed in the source layer 28a and the drain layer 28b. Also, when the source layer 28a and the drain layer 28b are over etched, the source layer 28a and the drain layer 28b can be penetrated, such that the bottoms of the opening sections 30a and 30b reach the dielectric layer 21b.

By penetrating the source layer 28a and the drain layer 28b when the opening sections 30a and 30b are formed, the amount of over etching does not need to be controlled so as not to penetrate the source layer 28a and the drain layer 28b, or the depth of the source layer 28a and the drain layer 28b does not need to be secured. For this reason, the single-crystalline semiconductor layer 21c can be thinned down into a thin film, and the field effective transistor can be readily operated in a completely depleted mode.

Next, as shown in FIG. 4(c), plugs 32a and 32b are formed in the opening sections 30a and 30b, respectively, embedded through barrier metal films 31a and 31b, respectively. For example, stacked layered films composed of Ti/TiN may be used as the barrier metal films 31a and 31b, and for example, W, Al, Cu or polycrystalline silicon can be used as the material of the plugs 32a and 32b.

Then, a metal film is sputtered on the interlayer dielectric film 29 where the plugs 32a and 32b are formed. The metal film is patterned by using a photolithography technique and an etching technique, thereby forming metal wiring layers 33a and 33b that are connected to the plugs 32a and 32b, respectively, on the dielectric layer 29.

As a result, the barrier metal film 31a can be brought in contact with the side walls of the single-crystalline semiconductor layer 27a and the source layer 28a which have mutually different band gaps or electron affinities, and the barrier metal film 31b can be brought in contact with the side walls of the single-crystalline semiconductor layer 27b and the drain layer 28b which have mutually different band gaps or electron affinities. As a result, a plurality of energy barriers can be provided with respect to the work function of the metal material, and the contact resistance can be reduced without changing the contact size.

Also, by forming the single-crystalline semiconductor layer 21c on the dielectric layer 21b, the source layer 28a and the drain layer 28b can be prevented from becoming short-circuited through the plugs 32a and 32b embedded in the opening sections 30a and 30b, even when the source layer 28a and the drain layer 28b are penetrated. Further, the energy barriers in the N type semiconductor region and the P type semiconductor region can be lowered without changing the composition of the metal wiring layers 33a and 33b in the N type semiconductor region and the P type semiconductor region.

For this reason, even when the single-crystalline semiconductor layer 21c is thinned down into a thin film, the contact structure can be controlled so as not to become complex, good contact characteristics can be obtained for both of the n type semiconductor region and the p type semiconductor region, CMOS circuits can be effectively manufactured, the device with a lower power consumption can be attained, the field effect transistor can be operated in a completely depleted mode, and operations of the field effect transistor at a higher speed with a lower voltage can be attained.

What is claimed is:

1. A semiconductor device characterized in comprising:
   a first semiconductor layer formed on a dielectric layer;
   a second semiconductor layer stacked on the first semiconductor layer and having a band gap or an electron affinity different from the first semiconductor layer;
   a metal wiring film that contacts the first semiconductor layer and second semiconductor layer, wherein the first semiconductor layer is Si, and the second semiconductor layer is SiGe;
   a gate electrode formed on the first semiconductor layer;
   source/drain layers disposed on both sides of the gate electrode, and formed in the first semiconductor layer with bottom sections thereof reaching the dielectric layer;
   the second semiconductor layer stacked on the source/drain layers;
   an opening section that penetrates the source layer or the drain layer and the second semiconductor layer and reaches the dielectric layer; and
   wherein the metal wiring film, that is embedded in the opening section, contacts the source layer or the drain layer and the second semiconductor layer at a side surface of the opening section.

2. A method for manufacturing a semiconductor device, characterized in comprising:
   forming semiconductor layers having mutually different band gaps or electron affinities on a semiconductor substrate;
   forming an interlayer dielectric film on the semiconductor layers;
   forming an opening section that penetrates the interlayer dielectric film and the semiconductor layers and exposes the semiconductor substrate; and
   forming a metal wiring film, which is embedded in the opening section, contacting the semiconductor substrate at a bottom of the opening section, and contacting the semiconductor layers at a side surface of the opening section, on the interlayer dielectric film.

3. The method of claim 2, further comprising:
   forming a dielectric layer on the semiconductor substrate, and
   forming a semiconductor layer on the dielectric layer.

4. The method according to claim 2, the semiconductor substrate is Si, and one of the semiconductor layers is SiGe.

5. A method for manufacturing a semiconductor device, characterized in comprising:
   forming a second semiconductor layer on a first semiconductor layer provided on a dielectric layer, which have mutually different band gap or electron affinities;
   forming an interlayer dielectric film on the first and second semiconductor layers;
   forming an opening section that penetrates the interlayer dielectric film, the first semiconductor layer and the second semiconductor layer, and reaches the dielectric layer;
   forming a metal wiring film, which is embedded in the opening section, and contacting the first semiconductor layer and the second semiconductor layer at a side surface of the opening section, on the interlayer dielectric film.

6. The method according to claim 5, wherein the first semiconductor layer is Si, and the second semiconductor layer is SiGe.

7. A semiconductor device characterized in comprising:
   a first layer formed on a dielectric layer;
   a second layer stacked on the first layer and having a band gap or an electron affinity smaller than the band gap or the electron affinity of the first layer;
   an opening section that penetrates the first layer and second layer and reaches the dielectric layer; and
   a metal wiring film, that is embedded in the opening section, and contacting the first layer and second layer at a side surface of the opening section.

* * * * *